United States Patent
Ishikawa et al.

(10) Patent No.: US 8,072,024 B2
(45) Date of Patent: Dec. 6, 2011

(54) NONVOLATILE SEMICONDUCTOR MEMORY DEVICE AND METHOD FOR MANUFACTURING SAME

(75) Inventors: Masao Ishikawa, Kanagawa-ken (JP); Katsunori Yahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 12/408,344

(22) Filed: Mar. 20, 2009

(65) Prior Publication Data

US 2009/0283819 A1   Nov. 19, 2009

(30) Foreign Application Priority Data

May 13, 2008   (JP) ................................ 2008-125856

(51) Int. Cl.
*H01L 29/792* (2006.01)
(52) U.S. Cl. ........ 257/324; 257/296; 257/301; 257/302; 257/303; 257/330; 257/405; 257/406; 257/E29.17; 257/E29.257; 257/E29.309; 257/E27.071; 257/E21.21; 257/E21.679; 438/243; 438/259; 438/261; 438/270; 438/386; 438/589; 438/591
(58) Field of Classification Search .......... 257/296, 257/301–303, 324, 330, 405, 406, E29.17, 257/E29.257, E29.309, E27.071, E21.21, 257/E21.679; 438/243, 259, 261, 270, 386, 438/589, 591
See application file for complete search history.

(56) References Cited

U.S. PATENT DOCUMENTS

| 2007/0158736 A1 | 7/2007 | Arai et al. |
| 2007/0252201 A1 | 11/2007 | Kito et al. |
| 2008/0048245 A1 | 2/2008 | Kito et al. |
| 2008/0067583 A1* | 3/2008 | Kidoh et al. .................. 257/326 |
| 2008/0157092 A1* | 7/2008 | Arai et al. ........................ 257/67 |
| 2008/0173928 A1* | 7/2008 | Arai et al. ...................... 257/316 |
| 2008/0173932 A1* | 7/2008 | Kidoh et al. .................. 257/324 |
| 2008/0217673 A1* | 9/2008 | Maruyama et al. ........... 257/306 |
| 2009/0184360 A1* | 7/2009 | Jin et al. ....................... 257/319 |

FOREIGN PATENT DOCUMENTS

JP    2007-266143    10/2007

OTHER PUBLICATIONS

U.S. Appl. No. 12/886,132, filed Sep. 20, 2010, Yahashi, et al.
U.S. Appl. No. 12/966,458, filed Dec. 13, 2010, Sakurai, et al.

* cited by examiner

*Primary Examiner* — Meiya Li
(74) *Attorney, Agent, or Firm* — Oblon, Spivak, McClelland, Maier & Neustadt, L.L.P.

(57) ABSTRACT

A nonvolatile semiconductor memory device with a substrate. A plurality of dielectric films and electrode films are alternately stacked on the substrate and have a through hole penetrating in the stacking direction. A semiconductor pillar is formed inside the through hole. A charge storage layer is provided at least between the semiconductor pillar and the electrode film. At least part of a side surface of a portion of the through hole located in the electrode film is sloped relative to the stacking direction.

17 Claims, 5 Drawing Sheets

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2008-125856, filed on May 13, 2008; the entire contents of which are incorporated herein by reference.

BACKGROUND OF THE INVENTION

1. Field of the Invention

This invention relates to a nonvolatile semiconductor memory device and a method for manufacturing the same, and more particularly to a nonvolatile semiconductor memory device with a plurality of dielectric films and electrode films alternately stacked on a substrate, and a method for manufacturing the same.

2. Background Art

Recently, to increase the density of flash memory, a technique for multilayering cells has been developed. In this technique, dielectric films and electrode films are alternately stacked on a substrate, and then through holes are simultaneously formed therein. A charge storage layer for retaining charge is formed on the side surface of the through holes, and a columnar electrode is buried inside each through hole. Thus, memory cells are three-dimensionally arranged at the intersections between the columnar electrodes and the electrode films. Then, a plurality of select gate lines extending in one direction are provided on the uppermost electrode film, and a plurality of bit lines extending in another direction are provided thereabove and connected to the upper end portion of the columnar electrodes, so that any of the columnar electrodes can be selected. On the other hand, each electrode film is connected to a different one of word interconnects so that any of the electrode films can be selected. This enables any of the memory cells to be selected for writing and reading data (see, e.g., JP-A-2007-266143(Kokai)).

However, in such a stacked flash memory, with the advance of downscaling, the amount of charge stored in each memory cell decreases and causes the problem of decreased reliability.

SUMMARY OF THE INVENTION

According to an aspect of the invention, there is provided a nonvolatile semiconductor memory device including: a substrate; a plurality of dielectric films and electrode films which are alternately stacked on the substrate and have a through hole penetrating in the stacking direction; a semiconductor pillar formed inside the through hole; and a charge storage layer provided at least between the semiconductor pillar and the electrode film, at least part of a side surface of a portion of the through hole located in the electrode film being sloped relative to the stacking direction.

According to another aspect of the invention, there is provided a method for manufacturing a nonvolatile semiconductor memory device, including: alternately stacking a plurality of dielectric films and electrode films on a substrate; forming a through hole penetrating through the stacked dielectric films and electrode films in the stacking direction; forming a charge storage layer at least on a region of a side surface of the through hole corresponding to the electrode film; and forming a semiconductor pillar inside the through hole, said forming a through hole including etching the electrode film, and at least part of the side surface of a portion of the through hole located in the electrode film being sloped relative to the stacking direction.

DETAILED DESCRIPTION OF THE INVENTION

An embodiment of the invention will now be described with reference to the drawings.

Figure 1:
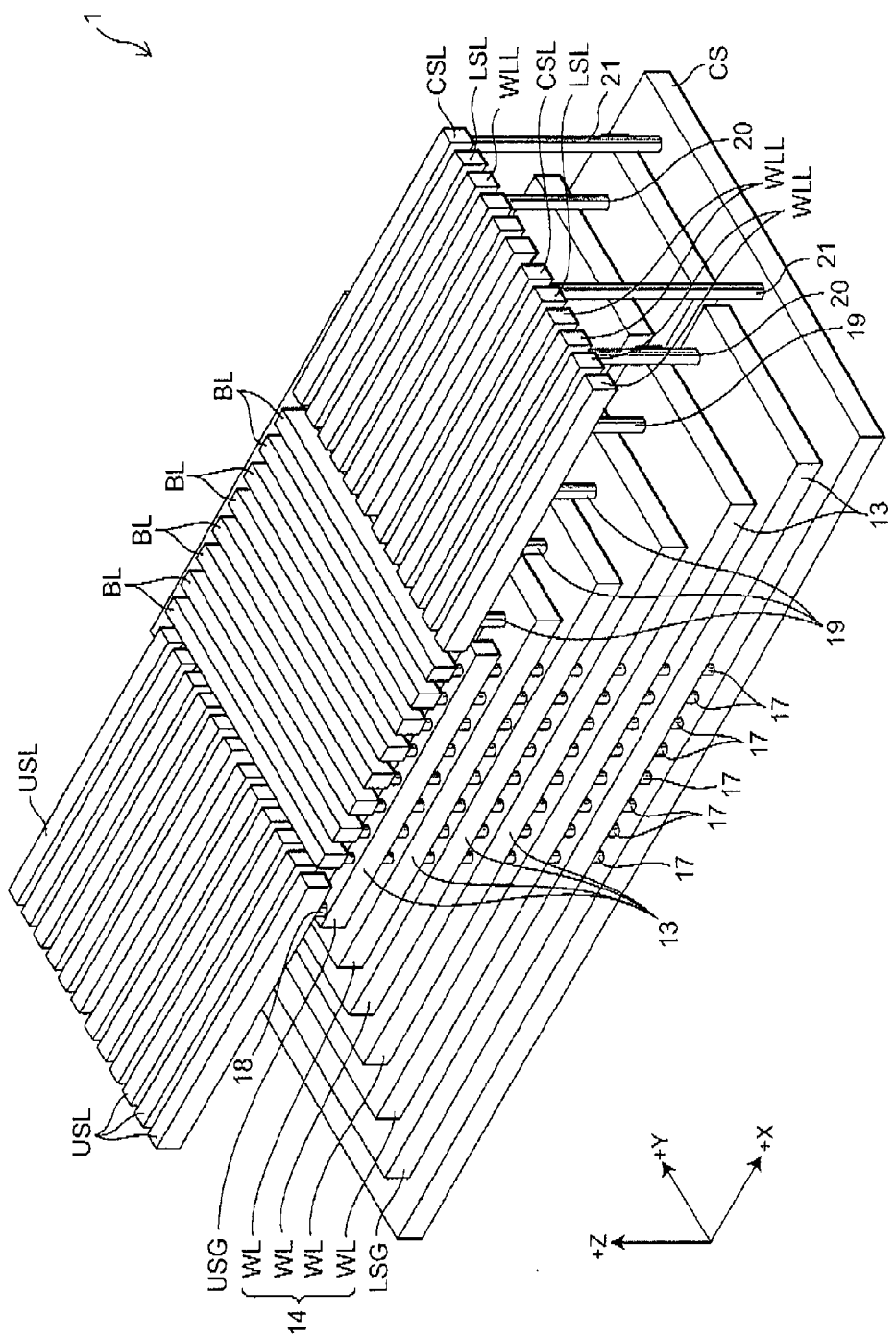
FIG. 1 is a perspective view illustrating a nonvolatile semiconductor memory device according to an embodiment of the invention.

FIG. 1 is a perspective view illustrating a nonvolatile semiconductor memory device according to this embodiment.

Figure 2:
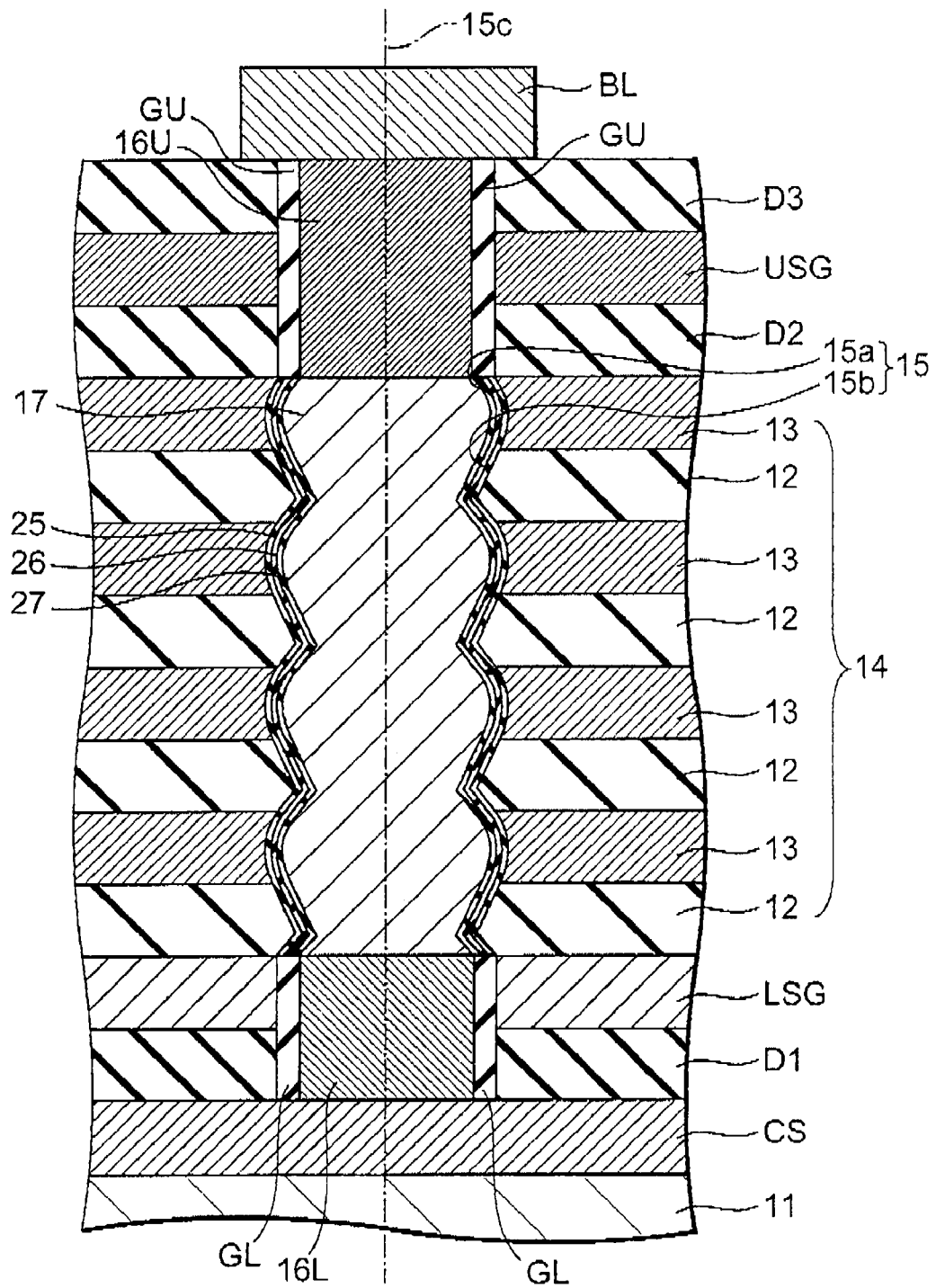
FIG. 2 is a cross-sectional view illustrating the nonvolatile semiconductor memory device according to this embodiment.

FIG. 2 is a cross-sectional view illustrating the nonvolatile semiconductor memory device according to this embodiment.

It is noted that in FIG. 1, for clarity of illustration, only the conductive portions are shown, and illustration of the dielectric portions is omitted. Furthermore, illustration of the silicon substrate 11 (see FIG. 2) except the cell source CS is also omitted. Moreover, in FIGS. 1 and 2, the number of stacked layers shown is smaller than in reality.

As shown in FIGS. 1 and 2, the nonvolatile semiconductor memory device 1 (hereinafter also simply referred to as "device 1") according to this embodiment includes a silicon substrate 11 illustratively made of single crystal silicon. A rectangular region in an upper portion of the silicon substrate 11 is doped with impurities to form a semiconductor region serving as a cell source CS. On the silicon substrate 11 immediately above the cell source CS, a dielectric film D1 illustratively made of silicon oxide ($SiO_2$) is provided, and a lower select gate LSG made of polycrystalline silicon is provided thereon.

Above the lower select gate LSG, a plurality of dielectric films 12 (see FIG. 2) illustratively made of silicon oxide ($SiO_2$) and a plurality of electrode films 13 illustratively made of polycrystalline silicon are alternately stacked to form a stacked body 14. The electrode film 13 serves as a word line WL, and the dielectric film 12 serves as an interlayer dielectric film for insulating the word lines WL from each other. The total thickness of the stacked body 14 is illustratively 300 to 600 nm, and the number of electrode films 13 is illustratively 64.

In the following, for convenience of description, an XYZ orthogonal coordinate system is herein introduced. In this coordinate system, the two directions parallel to the upper surface of the silicon substrate 11 and orthogonal to each other are referred to as the X and Y direction, and the direction orthogonal to both the X and Y direction, that is, the stacking direction of the dielectric films 12 and the electrode films 13, is referred to as the Z direction.

The electrode film 13 located higher has a shorter length in the X direction. That is, as viewed from above (+Z direction), each electrode film 13 is located inside the electrode films 13, the lower select gate LSG, and the cell source CS located therebelow. Dielectric films (not shown) are provided in regions in the ±X and ±Y directions as viewed from the electrode film 13. The stacked body 14 is provided in a plurality along the Y direction.

Furthermore, a dielectric film D2 is provided on the stacked body 14, an upper select gate USG illustratively made of polycrystalline silicon is provided thereon, and a dielectric film D3 is provided thereon. The upper select gate USG is formed so that one conductive film illustratively made of polycrystalline silicon is divided along the Y direction into a plurality of interconnecting conductive members extending in the X direction. On the other hand, the word line WL and the lower select gate LSG are formed for each stacked body 14, each being one plate-like conductive member parallel to the XY plane. The cell source CS is also not divided, but is formed into one plate-like conductive member constituting the XY plane so as to connect the immediately underlying regions of the plurality of stacked bodies 14.

Each dielectric film 12 and each electrode film 13 constituting the stacked body 14 include a plurality of through holes 15 extending in the stacking direction (Z direction). Each through hole 15 penetrates entirely through the stacked body 14, and its diameter is illustratively 90 nm. The through holes 15 are illustratively arranged in a matrix configuration along the X and Y direction, and the arrangement period of the through holes 15 is constant in each of the X and Y direction.

In this embodiment, the through hole 15 is not shaped like a simple cylinder, but a corrugation corresponding to the stacking period of the dielectric films 12 and the electrode films 13 is formed on the side surface. More specifically, the portion of the through hole 15 located in the electrode film 13 has a bowing shape in which the vertical (Z-direction) center portion bulges relative to the upper and lower portion. On the other hand, the portion of the through hole 15 located in the dielectric film 12 is shaped so that the vertical center portion is narrowed relative to the upper and lower portion. By way of example, the shape of the through hole 15 is circular as viewed from above, the portion located in the electrode film 13 is shaped like a barrel, and the portion located in the dielectric film 12 is shaped like an hourglass.

That is, as shown in FIG. 2, which shows a cross section including the central axis 15*c* of the through hole 15, the side surface 15*a* of the portion of the through hole 15 located in the electrode film 13 is concavely curved as viewed from inside the through hole 15. On the other hand, the portion of the through hole 15 located in the dielectric film 12 is convex as viewed from inside the through hole 15.

A semiconductor pillar 17 is formed inside each through hole 15. The semiconductor pillar 17 is formed from a semiconductor doped with impurities, such as polycrystalline silicon or amorphous silicon. In the cylindrical portion separating the semiconductor pillar 17 from the dielectric film 12 and the electrode film 13, a dielectric layer 25, a charge storage layer 26, and a dielectric layer 27 are laminated in this order from outside, that is, from the side of the dielectric film 12 and the electrode film 13. The dielectric layers 25 and 27 are illustratively made of silicon oxide ($SiO_2$), and the charge storage layer 26 is illustratively made of silicon nitride (SiN).

The semiconductor pillar 17 serves as a source, channel, and drain region, the word line WL serves as a control gate, and the charge storage layer 26 serves as a floating gate, so that they constitute a NAND flash memory serving as a memory cell. Thus, as many memory cells as the word lines WL are arranged in a line in the Z direction along one semiconductor pillar 17 and therearound to constitute one memory string. In the device 1, a plurality of semiconductor pillars 17 are arranged in a matrix configuration along the X and Y direction. Hence, a plurality of memory cells are arranged like a three-dimensional lattice along the X, Y, and Z direction.

Furthermore, as shown in FIG. 2, a columnar electrode 16L is provided immediately below the semiconductor pillar 17. The columnar electrode 16L penetrates through the dielectric film D1 and the lower select gate LSG, with the lower end being connected to the cell source CS and the upper end being connected to the semiconductor pillar 17. A gate dielectric film GL is provided so as to separate the columnar electrode 16L from the dielectric film D1 and the lower select gate LSG.

On the other hand, a columnar electrode 16U is provided immediately above the semiconductor pillar 17. The columnar electrode 16U penetrates through the dielectric film D2, the upper select gate USG, and the dielectric film D3, with the lower end being connected to the semiconductor pillar 17. A gate dielectric film GU is provided so as to separate the columnar electrode 16U from the dielectric film D2, the upper select gate USG, and the dielectric film D3. The columnar electrodes 16L and 16U are each formed from a semiconductor doped with impurities, such as polycrystalline silicon or amorphous silicon.

The columnar electrode 16U, the semiconductor pillar 17, and the columnar electrode 16L are integrally linked to constitute one columnar semiconductor member. As described above, the columnar electrode 16U penetrates through the upper select gate USG, the semiconductor pillar 17 penetrates through a plurality of word lines WL, and the columnar electrode 16L penetrates through the lower select gate LSG.

A plurality of bit interconnects BL extending in the Y direction are provided immediately above the region including the upper select gate USG on the dielectric film D3. The bit interconnect BL is formed from a metal such as tungsten (W), aluminum (Al), or copper (Cu). It is noted that the term "metal" used herein includes alloys as well as pure metals. The bit interconnects BL are provided immediately above the semiconductor pillars 17, and each bit interconnect BL is connected to the upper end portion of each column of the columnar electrodes 16U arranged along the Y direction. Thus, the semiconductor pillars 17 in different columns extending in the Y direction are connected to different bit interconnects BL. The bit interconnects BL are continuously disposed so as to extend immediately above the plurality of stacked bodies 14 arranged in the Y direction, and commonly connected to the semiconductor pillars 17 in the respective stacked bodies 14.

A plurality of upper select gate interconnects USL extending in the X direction are provided on the −X-direction side of the region including the bit interconnects BL. The upper select gate interconnect USL is formed from a metal such as tungsten, aluminum, or copper. The number of upper select gate interconnects USL is the same as the upper select gates USG, and each upper select gate interconnect USL is connected to a corresponding one of the upper select gates USG through a via 18.

Furthermore, on the +X-direction side of the region including the bit interconnects BL, for each stacked body 14, a plurality of word interconnects WLL extending in the X direction, one lower select gate interconnect LSL extending in the X direction, and one cell source interconnect CSL extending in the X direction are provided. The word interconnect WLL, the lower select gate interconnect LSL, and the cell source interconnect CSL are formed from a metal such as tungsten, aluminum, or copper. The number of word interconnects WLL for each stacked body 14 is the same as the number of word lines WL, and each word interconnect WLL is connected to a corresponding one of the word lines WL through a via 19. The lower select gate interconnect LSL is connected to the lower select gate LSG through a via 20, and the cell source interconnect CSL is connected to the cell source CS through a contact 21. The vias 19, 20 and the contact 21 are formed in a region immediately above the electrode film 13 to which they are connected, the region lying on the +X-direction side as viewed from the overlying electrode film 13.

The bit interconnect BL, the upper select gate interconnect USL, the word interconnect WLL, the lower select gate interconnect LSL, and the cell source interconnect CSL are identical in the position along the height (Z direction), thickness, and material, and illustratively formed by patterning one metal film. The interconnects are insulated from each other by an interlayer dielectric film (not shown).

The device 1 further includes a driver circuit for applying a potential to the upper end portion of the columnar electrode 16U through the bit interconnect BL, a driver circuit for applying a potential to the lower end portion of the columnar electrode 16L through the cell source interconnect CSL, the contact 21, and the cell source CS, a driver circuit for applying a potential to the upper select gate USG through the upper select gate interconnect USL and the via 18, a driver circuit for applying a potential to the lower select gate LSG through the lower select gate interconnect LSL and the via 20, and a driver circuit for applying a potential to each word line WL through the word interconnect WLL and the via 19 (all the driver circuits being not shown).

Next, an example method for manufacturing the device 1 according to this embodiment is described.

FIGS. 3 to 8 are process cross-sectional views illustrating a method for manufacturing a nonvolatile semiconductor memory device according to this embodiment.

First, as shown in FIG. 2, a rectangular region in an upper portion of a silicon substrate 11 is doped with impurities to form a cell source CS. Next, a dielectric film D1 is formed on the silicon substrate 11, and then a lower select gate LSG is formed. Next, through holes penetrating through the lower select gate LSG and the dielectric film D1 and reaching the cell source CS are formed in a matrix configuration. A gate dielectric film GL is formed on the side surface of each through hole, and a columnar electrode 16L is formed in the through hole.

Next, a plurality of dielectric films 12 and a plurality of electrode films 13 are alternately stacked on the silicon substrate 11 to form a stacked body 14. Here, for example, the dielectric film 12 is formed by depositing silicon oxide ($SiO_2$) by CVD (chemical vapor deposition), and the electrode film 13 is formed by depositing polycrystalline silicon by CVD. It is noted that a dielectric film (not shown) is formed around the electrode film 13.

Figure 3:
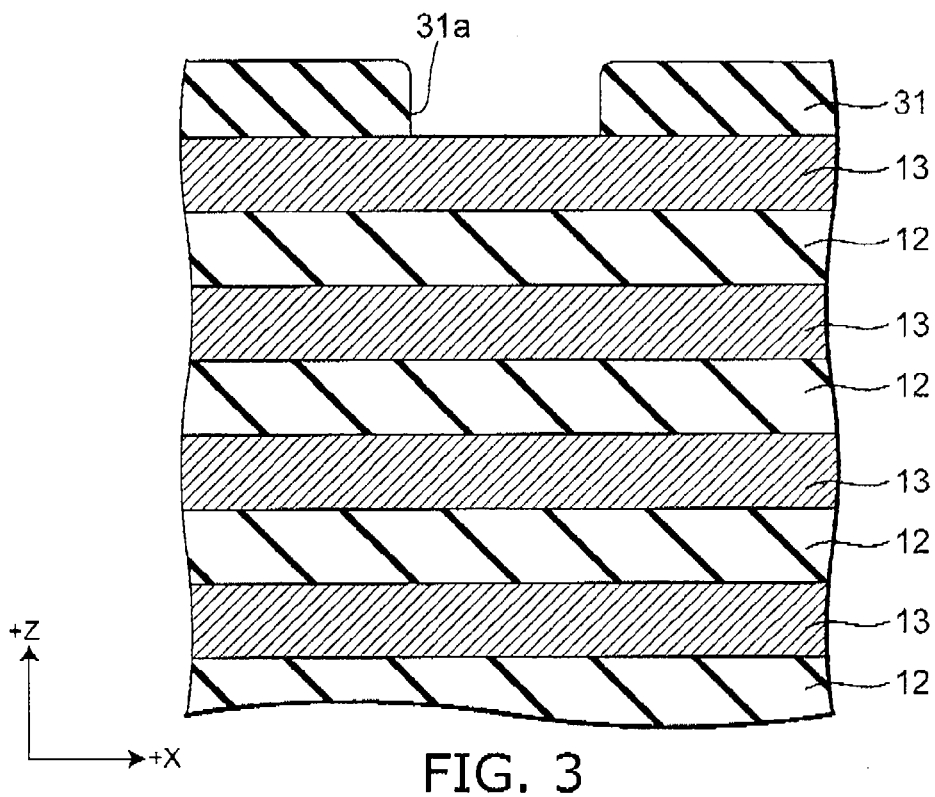
FIG. 3 is a process cross-sectional view illustrating a method for manufacturing a nonvolatile semiconductor memory device according to this embodiment.

Next, as shown in FIG. 3, a hard mask 31 is formed on the stacked body 14. The hard mask 31 has an opening 31a immediately above the region where the through hole 15 (see FIG. 2) is to be formed, that is, the columnar electrode 16L.

The shape of the opening 31a is illustratively circular as viewed from above (+Z direction), The hard mask 31 is used as a mask to perform dry etching to form a through hole 15 in the stacked body 14 immediately below the opening 31a. At this time, the stacked body 14 is continuously processed in one chamber to simultaneously form the through holes 15. In the following, the method for forming the through hole 15 is described in detail.

Figure 4:
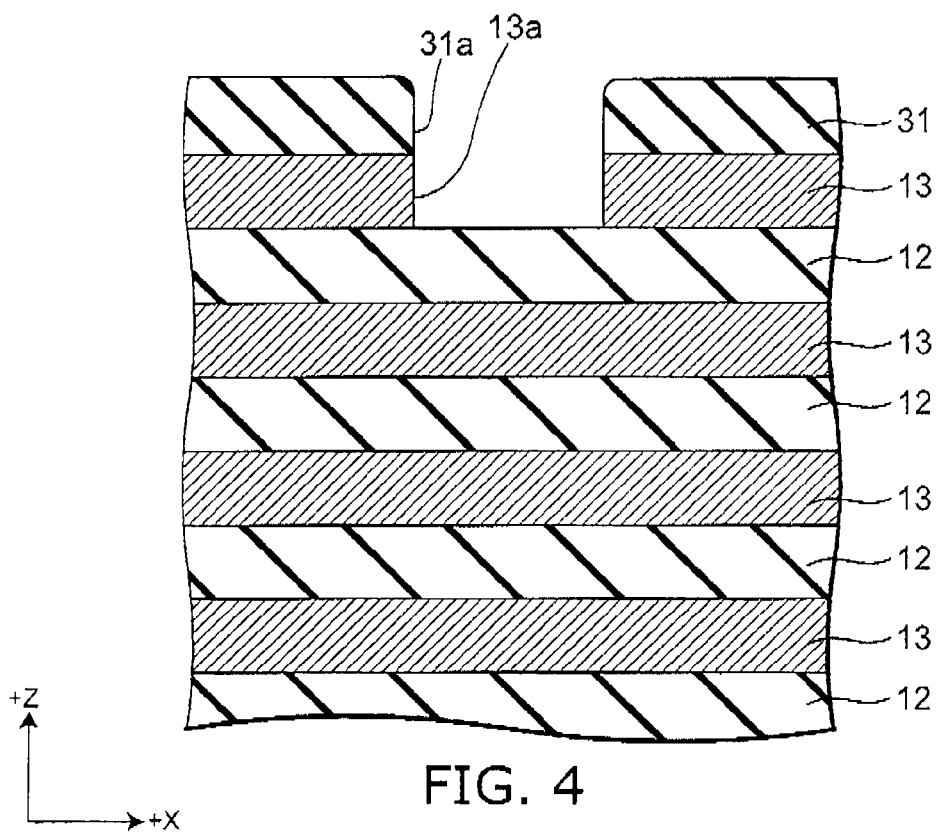
FIG. 4 is a process cross-sectional view illustrating a method for manufacturing a nonvolatile semiconductor memory device according to this embodiment.

As shown in FIG. 4, the etching gas for etching the electrode film 13 is illustratively a mixed gas of hydrogen bromide (HBr) and oxygen ($O_2$) (hereinafter referred to as "HBr/$O_2$ gas"). The etching condition at this time is such that the amount of generated radicals is large and the amount of exhausted reaction products is also large. Thus, immediately below the opening 31a of the hard mask 31, the electrode film 13 is selectively removed, and an opening 13a is formed. When the opening 13a reaches the dielectric film 12, the side surface of the opening 13a is nearly vertical. That is, the opening 13a has a generally cylindrical shape, and the side surface of the opening 13a is scarcely curved in the cross section including the central axis of the opening 13a and nearly parallel to the Z direction.

Figure 5:
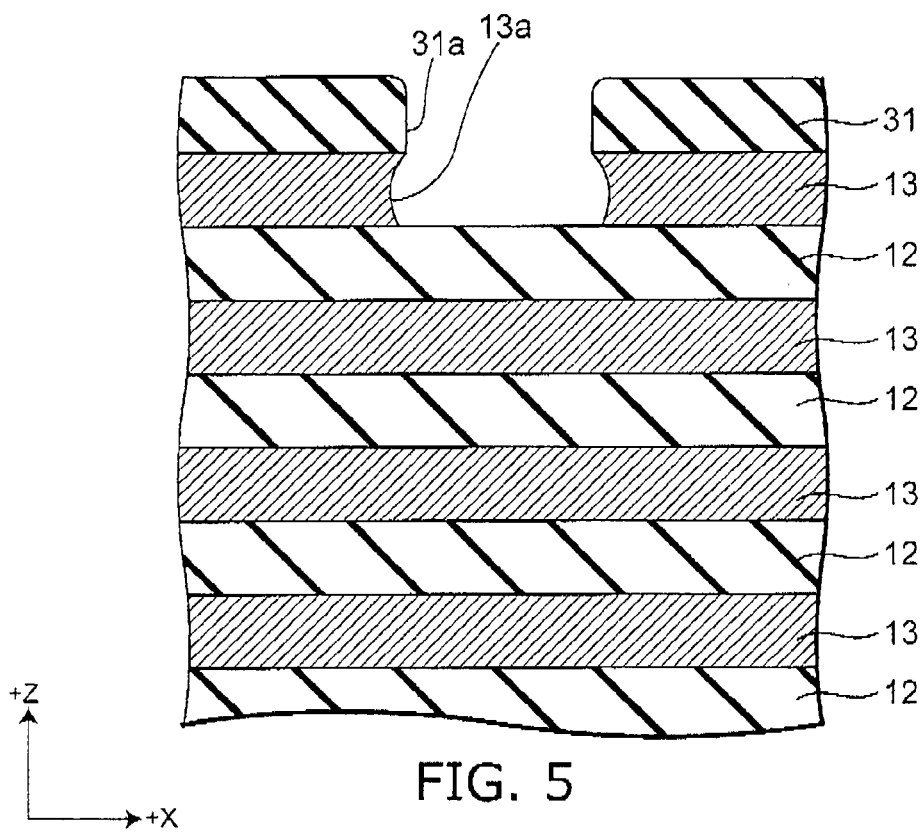
FIG. 5 is a process cross-sectional view illustrating a method for manufacturing a nonvolatile semiconductor memory device according to this embodiment.

Next, as shown in FIG. 5, the HBr/$O_2$ gas is used to further continue etching. Thus, etching proceeds horizontally (XY direction) on the side surface of the opening 13a. Consequently, the side surface of the opening 13a is processed into a concave shape to bulge outward. That is, the opening 13a has a bowing shape, and in the cross section including the central axis of the opening 13a, the side surface of the opening 13a is concavely curved as viewed from inside the opening 13a.

Figure 6:
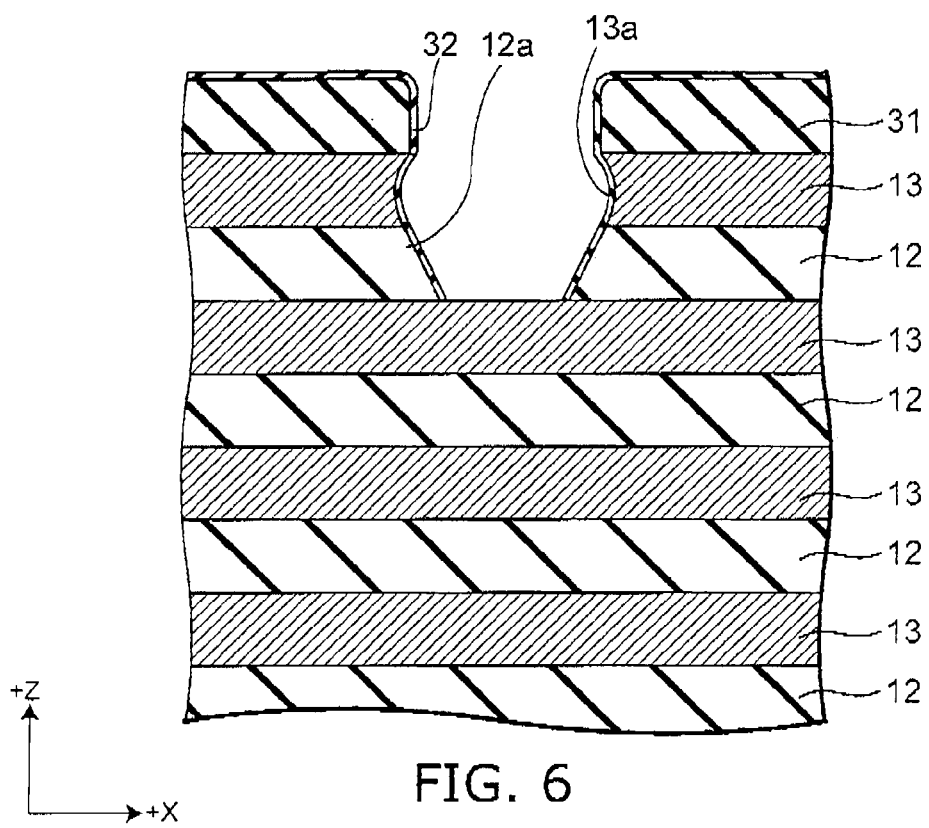
FIG. 6 is a process cross-sectional view Illustrating a method for manufacturing a nonvolatile semiconductor memory device according to this embodiment.

Next, as shown in FIG. 6, etching is performed using a gas containing fluorocarbons (CF). Thus, the dielectric film 12 exposed to the bottom of the opening 13a is etched and selectively removed, and an opening 12a is formed. The bottom of the opening 12a reaches the underlying electrode film 13. Here, the opening 12a has a forward tapered shape in which the inner diameter of the upper end portion is larger than the inner diameter of the lower end portion. For example, the opening 12a is shaped like an inverted truncated cone in which the upper surface has a relatively large diameter and the lower surface has a relatively small diameter. The taper angle, that is, the angle between the upper surface and the generatrix of the inverted truncated cone coinciding with the outline of the opening 12a, is illustratively 83°.

On the other hand, in this etching step, a CF-based protective film 32 such as a fluorocarbon polymer film is formed on the side surface of the opening 31a, the side surface of the opening 13a, and the side surface of the newly formed opening 12a. Thus, the exposed surface of the electrode film 13 is protected by the protective film 32 and prevented from additional etching.

Figure 7:
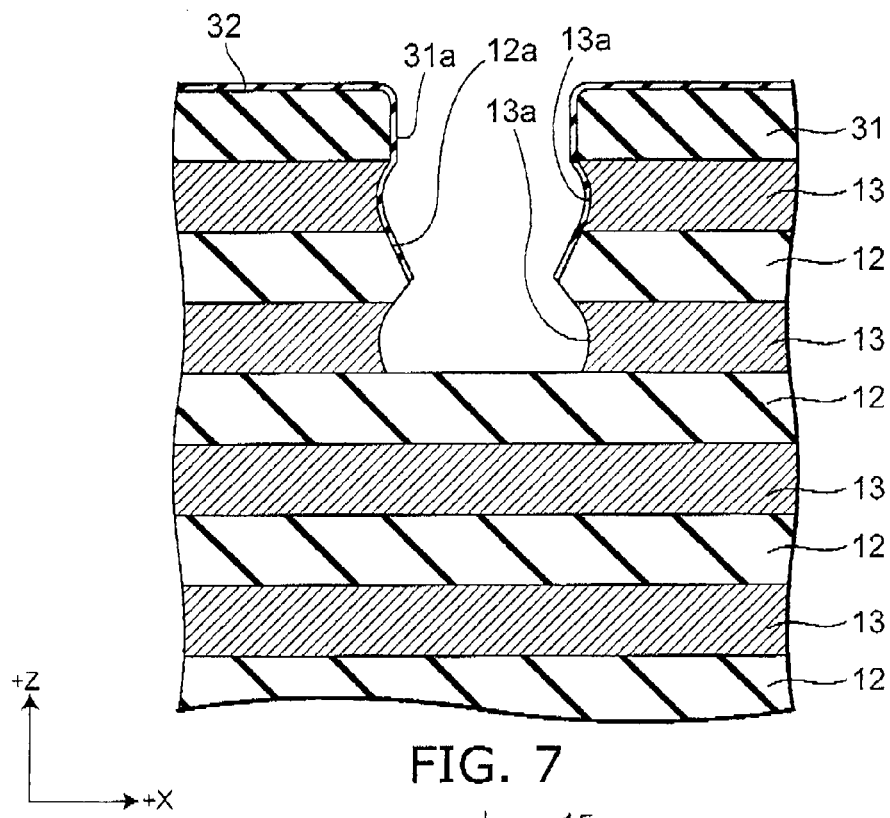
FIG. 7 is a process cross-sectional view illustrating a method for manufacturing a nonvolatile semiconductor memory device according to this embodiment.

Next, as shown in FIG. 7, etching is performed again using the HBr/$O_2$ gas. Thus, the electrode film 13 exposed to the bottom of the opening 12a is etched, and an opening 13a is formed in this electrode film 13. Here, the opening 13a has a bowing shape like the next higher opening 13a. With the etching of this electrode film 13, the lower portion of the side surface of the overlying opening 12a is also etched from below and removed by the etching gas entering the newly formed opening 13a. Consequently, the lower portion of the side surface of the opening 12a becomes farther from the central axis of the opening 12a than the Z-direction center portion thereof. On the other hand, the upper portion of the side surface of the opening 12a is already farther from the central axis of the opening 12a than the Z-direction center portion thereof. Thus, in the cross section including the central axis of the opening 12a, the side surface of the opening 12a is formed convex as viewed from inside the opening 12a.

Figure 8:
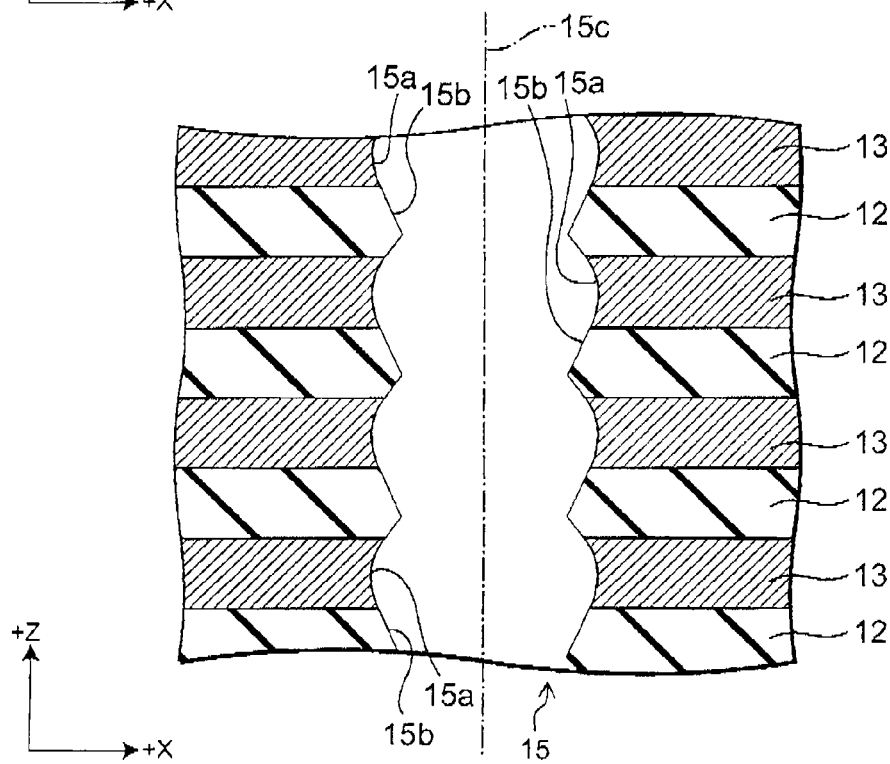
FIG. 8 is a process cross-sectional view illustrating a method for manufacturing a nonvolatile semiconductor memory device according to this embodiment.

Subsequently, the aforementioned process is repeated to alternately etch the electrode films 13 and the dielectric films 12 until the columnar electrode 16L (see FIG. 2) is reached. As shown in FIG. 8, this results in a through hole 15 in which, in the cross section including the central axis 15c, as viewed from inside, the side surface 15a of the portion located in the electrode film 13 is concavely curved and the side surface 15b of the portion located in the dielectric film 12 is convexly curved. In the through hole 15, the shape of the portions located in the adjacent pair of the electrode film 13 and the dielectric film 12 serves as a basic unit, which is repeated in the Z direction to constitute a periodic configuration.

Next, as shown in FIG. 2, a dielectric layer 25, a charge storage layer 26, and a dielectric layer 27 are formed in this order on the side surface of the through hole 15. Next, a semiconductor material, such as N-type polycrystalline silicon or amorphous silicon doped with donors, is buried in the through hole 15 to form a semiconductor pillar 17. Next, a dielectric film D2, an upper select gate USG, and a dielectric film D3 are formed on the stacked body 14, and a through hole is formed in these films immediately above the semiconductor pillar 17. A gate dielectric film GU is formed on the side surface of this through hole, and a columnar electrode 16U is formed in this through hole.

Next, as shown in FIG. 1, vias 19, 20 and a contact 21 are formed in the dielectric film on the lateral side of the stacked body 14. Next, a metal film is formed on the entire surface and patterned into bit interconnects BL, upper select gate interconnects USL, word interconnects WLL, a lower select gate interconnect LSL, and a cell source interconnect CSL. Thus, the nonvolatile semiconductor memory device 1 is manufactured.

Next, the operation and effect of this embodiment are described.

As shown in FIG. 1, in the device 1, the X coordinate of a memory cell is selected by selecting a bit line BL, the Y coordinate of the memory cell is selected by selecting an upper select gate USG, and the Z coordinate of the memory cell is selected by selecting a word line WL. Thus, one memory cell is selected from the device 1, and data is stored or erased by charge injection into or extraction from the charge storage layer 26 of this memory cell. Furthermore, the stored data is read by passing a sense current between the bit line BL and the cell source CS so that the sense current flows through this memory cell.

In this embodiment, as shown in FIG. 2, in the cross section including the central axis 15c of the through hole 15, the side surface 15a of the portion of the through hole 15 located in the electrode film 13 is curved. Thus, at least part of the side surface 15a is sloped relative to the stacking direction (Z direction). As a result, the area of the side surface 15a is larger than in the case where the side surface 15a is entirely parallel to the stacking direction, and hence the area of the charge storage layer 26 formed on the side surface 15a is increased. Thus, the amount of charge stored in each memory cell is increased. Consequently, even if the device 1 is downscaled, each memory cell can easily store a sufficient amount of charge, and high reliability can be ensured.

Furthermore, because the side surface 15a of the through hole 15 is curved in the cross section including the central axis 15c of the through hole 15, the diameter of the through hole is not significantly varied between the upper and lower end of the side surface 15a as compared with the case where the side surface 15a is linear. Thus, the through hole 15 is easily formed.

Moreover, when the through hole 15 is formed, if the dielectric film 12 is processed in the chamber intended for etching the electrode film 13, the opening 12a formed in the dielectric film 12 often has a forward tapered shape, with the diameter decreasing downward. Here, if the side surface of the opening 13a formed in the electrode film 13 is convex as viewed from inside in the cross section including the central axis of the through hole 15, the opening area of the through hole 15 as viewed from above becomes too small and makes etching difficult as the processing of the through hole 15 proceeds. In contrast, in this embodiment, the side surface of the opening 13a formed in the electrode film 13 bulges outward, and hence the opening area of the through hole 15 does not become too small. Thus, even if the processing of the through hole 15 proceeds, the verticality of the shape is maintained, and etching is not made difficult. Thus, a through hole 15 having a sufficiently high aspect ratio can be formed. Consequently, the number of stacked electrode films 13 can be increased, and the integration density of memory cells can be enhanced.

The invention has been described with reference to the embodiment. However, the invention is not limited to this embodiment. For example, those skilled in the art can suitably modify the above embodiment by addition, deletion, or design change of the components, or by addition, omission, or condition change of the processes, and such modifications are also encompassed within the scope of the invention as long as they fall within the spirit of the invention.

For example, in this embodiment, the etching gas for etching the electrode film 13 made of polycrystalline silicon is illustratively a mixed gas ($HBr/O_2$ gas) of hydrogen bromide (HBr) and oxygen ($O_2$). However, the invention is not limited thereto. The etching gas for etching the electrode film 13 may illustratively be a mixed gas ($Cl_2/O_2$ gas) of chlorine ($Cl_2$) and oxygen ($O_2$), a mixed gas ($HBr/N_2$ gas) of hydrogen bromide (HBr) and nitrogen ($N_2$), or a mixed gas ($Cl_2/N_2$ gas) of chlorine ($Cl_2$) and nitrogen ($N_2$).

In this embodiment, the dielectric film 12 is illustratively formed from silicon oxide ($SiO_2$). However, the invention is not limited thereto. For example, the dielectric film 12 may be formed from SiGe, which facilitates etching. Alternatively, the dielectric film 12 may be formed from SiN. SiN is a dielectric material commonly used in the field of semiconductor devices, and its characteristics and the method for forming it are well known. Hence, SiN is easy to use. Further alternatively, the dielectric film 12 may be formed from SiOC. By using SiOC, the dielectric film 12 can be made porous, and the dielectric constant of the dielectric film 12 can be decreased. Further alternatively, the dielectric film 12 may be formed from carbon (C), which facilitates stripping off.

On the other hand, in this embodiment, the electrode film 13 is illustratively formed from polycrystalline silicon. However, the invention is not limited thereto. For example, the electrode film 13 may be formed from amorphous silicon, or a metal such as aluminum (Al), tungsten (W), titanium (Ti), or titanium nitride (TiN).

Furthermore, in the example illustrated in this embodiment, in the cross section including the central axis 15c of the through hole 15, the side surface 15a of the portion of the through hole 15 located in the electrode film 13 is concavely curved as viewed from inside the through hole 15. However, the side surface 15a may be convexly curved. Alternatively, the side surface 15a may be tapered. Also in this case, as compared with the case where the side surface 15a is entirely parallel to the stacking direction, the area of the side surface 15a can be increased, the area of the charge storage layer 26 can be increased, and the amount of charge stored in the memory cell can be increased.

The invention claimed is:

1. A nonvolatile semiconductor memory device comprising:
   a substrate;
   a stacking body including a plurality of dielectric films alternately stacked with electrode films on the substrate and having a through hole penetrating in a stacking direction;
   a semiconductor pillar formed only inside the through hole and planar on the topmost surface of the stacking body; and
   a charge storage layer provided at least between the semiconductor pillar and the electrode films, wherein
   at least part of a side surface of a portion of the through hole located in the electrode films being sloped relative to the stacking direction.

2. The memory device according to claim 1, wherein in a cross section including the central axis of the through hole, the side surface of the portion of the through hole located in each electrode film is concave as viewed from inside the through hole.

3. The memory device according to claim 1, wherein in a cross section including the central axis of the through hole, the side surface of the portion of the through hole located in each electrode film is curved.

4. The memory device according to claim 3, wherein in a cross section including the central axis of the through hole, the side surface of the portion of the through hole located in each electrode film is concave as viewed from inside the through hole.

5. The memory device according to claim 1, wherein the portion of the through hole located in each electrode film has a bowing shape in which a center portion of the bowing shape in the stacking direction bulges relative to upper and lower portions of the bowing shape.

6. The memory device according to claim 5, wherein the through hole has a circular shape as viewed along the stacking direction.

7. The memory device according to claim 1, wherein a portion of the through hole located in each dielectric film has a shape in which a center portion in the stacking direction is narrowed relative to upper and lower portions of the narrowed shape.

8. The memory device according to claim 7, wherein the through hole has a circular shape as viewed along the stacking direction.

9. The memory device according to claim 1, wherein, in a cross section including the central axis of the through hole, a side surface of the portion of the through hole located in each electrode film is tapered.

10. The memory device according to claim 1, further comprising:
    a first dielectric layer provided between the electrode films and the charge storage layer and made of silicon oxide; and
    a second dielectric layer provided between the charge storage layer and the semiconductor pillar and made of silicon oxide, wherein
    the charge storage layer is formed from silicon nitride.

11. A nonvolatile semiconductor memory device comprising:
    a substrate;
    a plurality of dielectric films and electrode films which are alternately stacked on the substrate and have a through hole penetrating in a stacking direction;
    a semiconductor pillar formed inside the through hole; and
    a charge storage layer provided at least between the semiconductor pillar and the electrode films wherein,
    at least part of a side surface of a portion of the through hole located in the electrode films being sloped relative to the stacking direction, and
    in a cross section including the central axis of the through hole, the side surface of the portion of the through hole located in each electrode film is concave as viewed from inside the through hole.

12. The memory device according to claim 11, wherein the portion of the through hole located in each electrode film has a bowing shape in which a center portion of the bowing shape in the stacking direction bulges relative to upper and lower portions of the bowing shape.

13. The memory device according to claim 12, wherein the through hole has a circular shape as viewed from above.

14. The memory device according to claim 11, wherein a portion of the through hole located in each dielectric film has a shape in which a center portion in the stacking direction is narrowed relative to upper and lower portions of the narrowed shape.

15. The memory device according to claim 14, wherein the through hole has a circular shape as viewed from above.

16. The memory device according to claim 11, wherein, in a cross section including the central axis of the through hole, a side surface of the portion of the through hole located in each electrode film is tapered.

17. The memory device according to claim 11, further comprising:
    a first dielectric layer provided between the electrode films and the charge storage layer and made of silicon oxide; and
    a second dielectric layer provided between the charge storage layer and the semiconductor pillar and made of silicon oxide, wherein
    the charge storage layer is formed from silicon nitride.

* * * * *